United States Patent [19]
Botez et al.

[11] 4,416,012
[45] Nov. 15, 1983

[54] W-GUIDE BURIED HETEROSTRUCTURE LASER

[75] Inventors: Dan Botez, Mount Holly; Michael Ettenberg, Freehold, both of N.J.

[73] Assignee: RCA Corporation, New York, N.Y.

[21] Appl. No.: 323,058

[22] Filed: Nov. 19, 1981

[51] Int. Cl.³ .............................................. H01S 3/19
[52] U.S. Cl. ........................................ 372/45; 357/17
[58] Field of Search ................ 372/44, 45, 46; 357/17

[56] References Cited

U.S. PATENT DOCUMENTS

| 3,753,801 | 8/1973 | Lookwood et al. | 148/171 |
| 4,048,627 | 9/1977 | Ettenberg et al. | 357/17 |
| 4,116,733 | 9/1978 | Olsen et al. | 148/175 |

OTHER PUBLICATIONS

K. Shima et al., "Improvement of Photoluminescence Property of (GaAl) as Double-Heterostructure Laser with Buffer Layer", *Appl. Phys. Lett.*, 36(6), Mar. 15, 1980, pp. 395–397.
Transverse Mode Control & Reduction of Threshold Current in (GaAl) as Buried-Heterostructure Lasers with a Buried Optical Guide by H. Nakashima et al., Japanese Journal of Applied Physics, pp. L591–L594.
Characteristics of a Doubly Clad Optical Fiber with a Low-Index Inner Cladding by S. Kawakami et al., IEEE Journal of Quantum Electronics, Dec. 1974, pp. 879–887.
Buried-Heterostructure AlGaAs Lasers by K. Saito et al., IEEE Journal of Quantum Electronics, Feb. 1980, pp. 205–215.

*Primary Examiner*—James W. Davie
*Attorney, Agent, or Firm*—Birgit E. Morris; Donald S. Cohen; William J. Burke

[57] ABSTRACT

The invention is an improved buried heterostructure laser wherein the improvement comprises a cladding layer which is interposed between the mesa and the burying region and has a refractive index less than that of the burying region and the effective refractive index of the fundamental transverse mode. The discrimination against higher order modes of propagation provided by the structure permits the use of a wider active layer and thus a larger emitting area.

9 Claims, 1 Drawing Figure

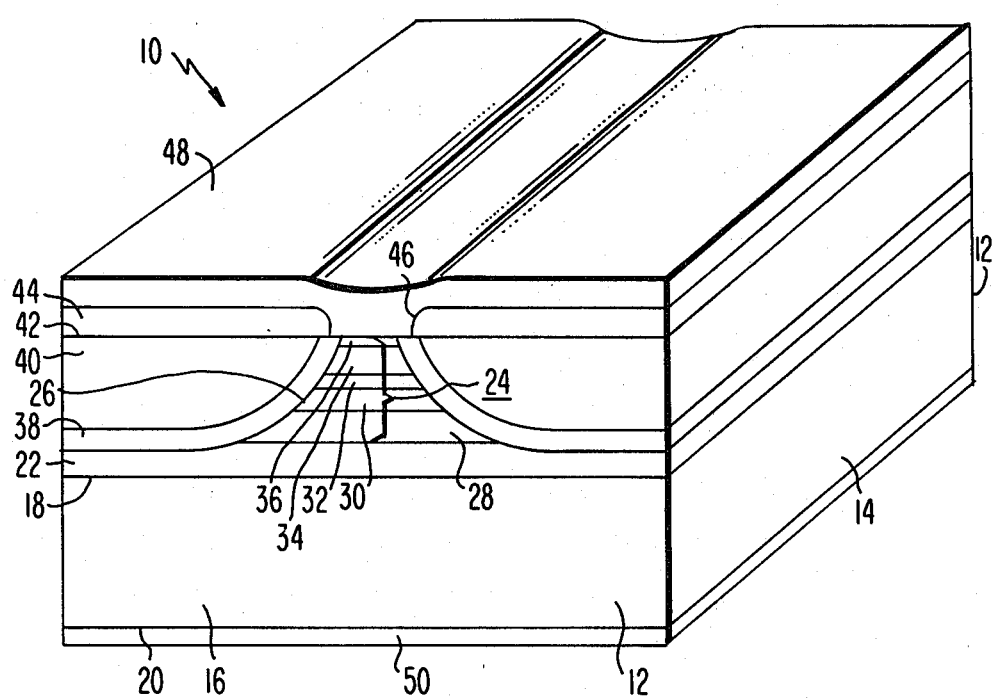

W-GUIDE BURIED HETEROSTRUCTURE LASER

The invention relates to a buried heterostructure semiconductor laser and in particular to such a laser which has an increased output power capability in the fundamental optical mode.

BACKGROUND OF THE INVENTION

A semiconductor laser typically includes a substrate, a first confinement layer overlying the substrate, an active layer overlying the first confinement layer and a second confinement layer overlying the active layer. The refractive index of the active layer is greater than that of the first and second confinement layers thereby providing an optical guide which confines the light beam generated therein to operate in the fundamental mode in the direction transverse to the plane of the layers. A buried heterostructure laser provides an optical guide in the lateral direction, the direction in the plane of the layers and perpendicular to the direction of propagation of the light beam, by embedding a mesa which includes the active and confinement layers in a lower refractive index burying region. Ettenberg et al., in U.S. Pat. No. 4,048,627, has disclosed such a laser having a cladding layer interposed between the mesa and the burying region with a p-n junction therebetween to block current flow through the burying region. By proper choice of the difference between the effective refractive index of the fundamental transverse mode in the mesa (the mode in the direction perpendicular to the plane of the layers) and the refractive index of the burying region and the width of the mesa in the lateral direction, operation of the laser in the fundamental lateral mode can be obtained while operation in higher order lateral modes is suppressed. However, the useful range of output powers is limited by the onset of oscillation in higher order lateral modes and by the small emitting area of such devices.

It would be useful to have a buried heterostructure laser which operates only in the fundamental lateral mode over an increased range of output powers and which has a larger emitting area.

SUMMARY OF THE INVENTION

The invention is an improved buried heterostructure laser where the improvement comprises a cladding layer interposed between the active layer and the burying region which has a refractive index which is less than the effective refractive index of the fundamental transverse mode in the mesa and the reflective index of the burying region and has a width in the lateral direction which is less than that of the active layer, thereby forming a W-shaped refractive index guide in the lateral direction. This structure provides increased radiative losses for the higher order lateral modes and permits the use of a wider active region and thus a larger emitting area.

BRIEF DESCRIPTION OF THE DRAWING

The FIGURE is a perspective view of the buried heterostructure laser of the invention.

DETAILED DESCRIPTION OF THE INVENTION

Referring to the FIGURE, a buried heterostructure laser 10 comprises a parallelopiped of semiconductor material having spaced parallel end faces 12, which are partially reflecting of light and at least one of which is partially transparent so the light may be emitted therefrom, and spaced, parallel side surfaces 14 which extend between and are perpendicular to the end faces 12. The semiconductor laser 10 includes a substrate 16 having spaced parallel major surfaces 18 and 20 which extend between both the end faces 12 and the side surfaces 14. A buffer layer 22 overlies the major surface 18 and a mesa 24, which extends between the end faces 12 and has a pair of side walls 26, overlies the buffer layer 22. The mesa 24 comprises a first confinement layer 28 overlying a portion of the surface of the buffer layer 22, a guide layer 30 overlying the first confinement layer 28, an active layer 32 overlying the guide layer 30, a second confinement layer 34 overlying the active layer 32 and a capping layer 36 overlying the second confinement layer 34. A cladding layer 38 overlies the side walls 26 of the mesa 24 and a portion of the buffer layer 22. The burying region 40 overlies the cladding layer 38, extends to the side surfaces 14 and has a surface 42 which is substantially coplanar with the surface of the capping layer 34. A passivation layer 44 overlies the surface 42 and has an opening 46 extending therethrough in the form of a stripe extending between the end faces 12 over the mesa 24. A first electrical contact 48 overlies the passivation layer 44 and contacts the capping layer 36 in the region of the opening 46. A second electrical contact 50 overlies the second major surface 20 of the substrate 16.

The substrate 16, the buffer layer 22, and the first confinement layer 28 are of one conductivity type and the second confinement layer 34 and the capping layer 36 are of the opposite conductivity type. The cladding layer 38 and the burying region 40 may be of either conductivity type so long as they have high resistivity or, preferably, are semi-insulating. Alternatively the burying region 40 may be composed of regions of opposite conductivity type so that current flow through the burying region is blocked by the reverse biased p-n junction during the operation of the device.

The dimensions and the material composition of the active layer 32 are so chosen that the refractive index of the active layer 32 at the wavelength of the light emitted by the laser 10 is greater than the refractive index of the guide layer 30, the first and second confinement layers 28 and 34, respectively, and of the cladding layer 38. The refractive index of the burying region 40 is greater than that of the cladding region 38 and may be greater or less than the effective refractive index of the fundamental transverse mode in the mesa 24.

The substrate 16 is typically composed of a binary Group III–V compound, preferably n-type GaAs whose surface 18 is parallel to the {100} crystallographic plane. In the selection of the substrate and the layers deposited thereon it is desirable that the layers be lattice matched to the substrate, i.e., the different layers have the same crystallographic structure and preferably have differences in their lattice constants of less than 0.1%.

The different layers of the laser 10 may be deposited on the substrate 16 by liquid phase epitaxy as described by H. F. Lockwood et al. in U.S. Pat. No. 3,753,801, incorporated herein by reference, or by vapor phase epitaxy as disclosed by G. H. Olsen et al. in U.S. Pat. No. 4,116,733, incorporated herein by reference, or by a combination of these methods.

The buffer layer 22 is typically composed of the same material and has the same conductivity type as the substrate 16 and is typically between about 0.5 and about 5 micrometers (μm) thick.

The first confinement layer 28 is composed of n-type $Al_wGa_{1-w}As$ where the fractional concentration w of Al is typically between about 0.25 and about 0.4 and is preferably about 0.35. For the injection laser 10 this layer is typically between about 1 and 3 μm thick. The guide layer 30 has a refractive index which is less than that of the active layer 32 and greater than that of the first and second confinement layers 28 and 34, respectively. This layer is typically composed of an AlGaAs alloy and is between about 0.5 and 1.5 μm thick. The guide layer 30 is shown as being interposed between the active and first confinement layers but, if present, need only be adjacent to the active layer on either side and have the same conductivity type as the adjacent confinement layer. The utility of this layer lies in that the output beam propagates at both the active and guide layers thereby producing a greater beam width in the direction transverse to the plane of the layers.

The active layer 32 is typically composed of $Al_yGa_{1-y}As$ where the fractional concentration y of Al is less than that in the first and second confinement layers 28 and 34, respectively, and the cladding layer 38. The active layer 32 is typically less than about 0.5 μm thick and is preferably between about 0.05 and about 0.2 μm thick. The width of the active layer 32 is preferably between about 2 and 5 μm.

The second confinement layer 34 is typically between about 1 and about 3 μm thick and is composed of p-type conductivity $Al_zGa_{1-z}As$ where the fractional concentration z of Al is typically between about 0.25 and about 0.4 and is preferably about 0.35.

The capping layer 34 is present to insure good electrical contact of the laser 10 and is typically composed of p-type GaAs between about 0.2 and 1.5 μm thick.

After these layers have been deposited on the substrate 16 the mesa 24 is formed using standard photolithographic, masking and chemical etching techniques. Preferably, portions of the confinement, active and capping layers and a portion of the buffer layer are removed, leaving a mesa between about 2 and 5 μm wide at the active layer 32 and extending between the end faces 12. The cladding layer 38 and the burying region 40 are then deposited using liquid or vapor phase epitaxy.

The cladding layer 38 is preferably composed of n-type $Al_rGa_{1-r}As$ where the fractional concentration r of Al is typically between about 0.2 and 0.4. The width of the cladding layer 38 is preferably between about 0.1 and 2 μm. The ratio of the width of the cladding layer 38 to the lateral width of the active layer 32 after the mesa 24 is formed is typically between about 0.05 and 1.0 and is preferably between 0.1 and 0.5.

The burying region 40 is composed of high resistivity $Al_sGa_{1-s}As$ where the fractional concentration s of Al is chosen so as to provide the desired refractive index refraction for the burying region 40 relative to the effective refractive index of the fundamental transverse mode in the mesa 24. Preferably the difference between the refractive indices of the burying region 40 and the cladding layer 38 is less than about 0.05.

The passivation layer 42 is preferably composed of $SiO_2$ about 0.1 μm thick and is deposited on the surface 42 by pyrolytic decomposition of silane in oxygen or water vapor. The opening 46 is then formed through this layer over the mesa 24 using standard photolithographic and chemical etching techniques. The first electrical contact 48 is preferably composed of titanium, platinum and gold and is deposited over the passivation layer 44 and over the surface of the capping layer 36 in the opening 46 using vacuum evaporation techniques. The second electrical contact 50 may be composed of tin and silver and is deposited on the opposite surface 20 of the substrate 16 by sequential vacuum evaporation and sintering steps.

The cladding layer 38 and the burying region 40 can be deposited in one step by continually varying the composition during the growth process. For example, for a cladding layer and burying region composed of AlGaAs, the concentration of aluminum may be decreased during the deposition to provide the desired index of refraction profile.

While these light emitting devices have been described as being composed of GaAs and alloys of AlGaAs, it is to be understood that other combinations of Group III—V alloys may be used in the laser of the invention. For example, the substrate and buffer layer may be composed of InP while the other layers are composed of InGaAs or InGaAsP alloys. In addition, the conductivity types of the substrate, the different layers and regions may differ from that described above so long as the relationships between the conductivity types of individual elements of the laser are maintained.

The threshold for oscillation and the fractional concentration of power in a particular lateral mode of propagation depend upon the radiative mode losses which in turn depend upon the effective refractive index in the lateral direction for the particular mode. The effective lateral refractive index for a mode is a combination of the transverse effective refractive index $N_a$ in the mesa 24, the refractive index $N_c$ of the cladding layer 38 and the refractive index $N_b$ of the burying region 40. In the present invention $N_c$ is always less than $N_a$ and $N_b$, while $N_b$ may be greater or less than $N_a$ thereby forming an optical cavity known as a W-guide because the lateral refractive index profile resembles the latter W. In the limit where $N_c = N_b$, and $N_a > N_b$ a standard buried heterostructure laser is formed.

For the structure where $N_c < N_b < N_a$, the index profile is that of a positive index guide and the confinement of the modes in the active region dominates. The fundamental mode and some higher order modes are supported and have about the same threshold. As $N_b$ increases the degree of confinement of the higher order modes decreases, resulting in higher radiative losses and thus higher thresholds for these modes relative to the fundamental mode. The ratio of the losses in two modes is roughly proportional to the ratio of their mode numbers curbed when $N_b = N_a$. In the case where $N_b > N_a$ the refractive index profile is that of an anti-guide and the radiative loss exists for both the fundamental and higher order modes. The ratio of the radiative losses in two modes of propagation is roughly proportional to the ratio of their mode numbers squared. The optimum refractive index profile is then a compromise between the anti-guide which has the maximum discrimination, higher threshold and higher output power capability in the fundamental mode, and the positive refractive index guide which has a lower threshold, lower discrimination and lower fundamental mode output power. Preferably, $N_a < N_b$.

In a conventional buried heterostructure laser the lateral width of the active layer is limited to between about 1 and 2 μm so that only the fundamental mode will propagate. In the W-guide structure of the invention this requirement for the width of the active layer is relaxed since the higher radiative losses for the higher order modes result in increased thresholds and thus increased discrimination against these modes. The increased thresholds for the higher order modes results in a range of laser output powers where the output laser beam propagates only in the fundamental lateral mode with an increased lateral width.

We claim:

1. In a buried heterostructure laser which emits light at a particular wavelength comprising a substrate having two opposed major surfaces, a mesa having side walls and overlying a portion of said first major surface, a cladding layer overlying the side walls of said mesa and the remainder of said first surface of said substrate, and a burying region overlying said cladding layer wherein said mesa comprises a first confinement layer overlying a portion of said surface of said substrate, an active layer overlying said first confinement layer and a second confinement layer overlying said active layer and wherein electrical contacts overlie said second confinement layer and a portion of said second major surface of said substrate;

the improvement comprising said cladding layer having a refractive index at said wavelength which is less than the effective refractive index of the fundamental transverse mode in said mesa and wherein the refractive index of said burying region is greater than or equal to the effective refractive index of said mode in said mesa.

2. The article of claim 1 wherein the ratio of the lateral width of said cladding layer to the lateral width of said active layer is less than about 1.

3. The article of claim 2 wherein the width of said active region is between about 2 and about 5 micrometers.

4. The article of claim 2 wherein the width of said cladding layer is between about 0.1 and 2 micrometers.

5. The article according to claim 2 wherein said ratio is between about 0.1 and 0.5.

6. The article according to claim 1 wherein the difference in the refractive indices of said burying region and said cladding layer at said wavelength is less than about 0.5.

7. The article according to claim 1 wherein a buffer layer is interposed between said substrate and said mesa and a capping layer is interposed between a second confinement layer and a first electrical contact.

8. The article according to claim 7 wherein a guide layer is interposed between said active layer and one of said confinement layers and wherein said guide layer has a refractive index at said wavelength which is greater than that of said confinement layer and less than that of said active layer.

9. The article according to claim 7 wherein said substrate, buffer layer and capping layer are composed of GaAs and said confinement layers, said cladding layer and said burying region are composed of AlGaAs alloys.

* * * * *

UNITED STATES PATENT AND TRADEMARK OFFICE
CERTIFICATE OF CORRECTION

PATENT NO. : 4,416,012

DATED : November 15, 1983

INVENTOR(S) : Dan (NMN) Botez et al.

It is certified that error appears in the above-identified patent and that said Letters Patent is hereby corrected as shown below:

Column 4, line 52, "curbed" should be --cubed--.

Claim 6, column 6, line 4, "0.5" should be --0.05--.

Signed and Sealed this

Seventeenth Day of January 1984

[SEAL]

Attest:

GERALD J. MOSSINGHOFF

Attesting Officer

Commissioner of Patents and Trademarks